US012598946B2

(12) United States Patent
Kim

(10) Patent No.: US 12,598,946 B2
(45) Date of Patent: Apr. 7, 2026

(54) FIXTURES AND METHODS FOR POSITIONING PROCESS KIT COMPONENTS WITHIN REACTION CHAMBERS

(71) Applicant: ASM IP Holding B.V., Almere (NL)

(72) Inventor: KiHyun Kim, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 970 days.

(21) Appl. No.: 17/584,724

(22) Filed: Jan. 26, 2022

(65) Prior Publication Data
US 2022/0243324 A1 Aug. 4, 2022

Related U.S. Application Data

(60) Provisional application No. 63/143,415, filed on Jan. 29, 2021.

(51) Int. Cl.
*H01L 21/677* (2006.01)
*C23C 16/458* (2006.01)

(52) U.S. Cl.
CPC .... *H01L 21/67742* (2013.01); *C23C 16/4585* (2013.01); *C23C 16/4586* (2013.01); *H01L 21/67739* (2013.01); *H01L 21/67745* (2013.01)

(58) Field of Classification Search
CPC ............ C23C 16/4583; C23C 16/4584; C23C 16/4585; C23C 16/4586; H01L 21/673; H01L 21/6732; H01L 21/681; H01L 21/68707; H01L 21/68785; H01L 21/677; H01L 21/67763; H01L 21/67766; H01L 21/67778; H01L 21/67781;
(Continued)

(56) References Cited

U.S. PATENT DOCUMENTS

| | | | | |
|---|---|---|---|---|
| 4,671,726 A | * | 6/1987 | Thuen | ............... H01L 21/67754 414/940 |
| 4,721,424 A | * | 1/1988 | Aldridge | ........... H01L 21/67126 403/353 |
| 5,833,764 A | | 11/1998 | Rader | |

(Continued)

FOREIGN PATENT DOCUMENTS

| | | | | |
|---|---|---|---|---|
| CN | 110567639 A | * | 12/2019 | ............. G01L 25/00 |
| JP | 2007208235 A | * | 8/2007 | |

(Continued)

*Primary Examiner* — Gordon Baldwin
*Assistant Examiner* — Todd M Seoane
(74) *Attorney, Agent, or Firm* — Snell & Wilmer L.L.P.

(57) ABSTRACT
A fixture, for example, comprised in a semiconductor processing system, includes a standoff arranged for fixation relative to a reaction chamber of a semiconductor processing system. A slide member is slidably supported by the standoff and is translatable along a carrying axis extending into the reaction chamber. A male threaded member depends from the slide member and is rotatable about a seating axis that is angled relative to the carrying axis. A paddle member depends from the male threaded member, defines along the carrying axis, is fixed relative to slide member along the carrying axis to carry a component of a process kit into the reaction chamber using translation of the slide member, and is free relative to the slide member along the seating axis to seat the process kit component within the reaction chamber using rotation of the male threaded member.

18 Claims, 12 Drawing Sheets

(58) Field of Classification Search
CPC ........ H01L 21/67739–67757; H01J 37/32568;
H01J 37/32605; H01J 37/321; C30B
25/12

See application file for complete search history.

(56) References Cited

U.S. PATENT DOCUMENTS

| | | | |
|---|---|---|---|
| 6,086,680 | A | 7/2000 | Foster et al. |
| 6,375,749 | B1 | 4/2002 | Boydston |
| 7,108,753 | B2 | 9/2006 | Wood |
| 7,871,470 | B2 | 1/2011 | Schieve |
| 9,401,271 | B2 | 7/2016 | Pitney |
| 9,922,819 | B2 | 3/2018 | Balasubramanian |
| 2006/0216137 | A1* | 9/2006 | Sakata .............. H01L 21/67766 |
| | | | 414/222.13 |
| 2007/0273892 | A1* | 11/2007 | Asari ................ H01L 21/67757 |
| | | | 356/614 |
| 2011/0100554 | A1 | 5/2011 | Carlson |
| 2014/0130732 | A1* | 5/2014 | Bang ................. H01L 21/68764 |
| | | | 15/268 |
| 2016/0010239 | A1 | 1/2016 | Tong |
| 2016/0020086 | A1 | 1/2016 | Tsai |
| 2016/0204019 | A1* | 7/2016 | Ishii ...................... C30B 35/005 |
| | | | 269/296 |
| 2017/0117170 | A1* | 4/2017 | Wong ................ H01L 21/67369 |
| 2018/0138031 | A1 | 5/2018 | Ranish |
| 2019/0276929 | A1 | 9/2019 | Mebarki et al. |
| 2020/0224309 | A1 | 7/2020 | Sreeram et al. |

FOREIGN PATENT DOCUMENTS

| | | | |
|---|---|---|---|
| KR | 20100115181 | A | * 10/2010 |
| KR | 101492939 | B1 | * 2/2015 |
| TW | 201434100 | A | 9/2014 |

* cited by examiner

FIXTURES AND METHODS FOR POSITIONING PROCESS KIT COMPONENTS WITHIN REACTION CHAMBERS

CROSS-REFERENCE TO RELATED APPLICATIONS

This application is a non-provisional of, and claims priority to and the benefit of, U.S. Provisional Patent Application No. 63/143,415, filed Jan. 29, 2021 and entitled "FIXTURES AND METHODS FOR POSITIONING PROCESS KIT COMPONENTS WITHIN REACTION CHAMBERS," which is hereby incorporated by reference herein.

FIELD OF INVENTION

The present disclosure generally relates to semiconductor processing systems. More particularly, the present disclosure relates to positioning components of process kits within reaction chambers of semiconductor processing systems.

BACKGROUND OF THE DISCLOSURE

Semiconductor processing systems are commonly used to deposit films onto substrates, such as during the fabrication of semiconductor devices like very large-scale integrated circuits and power electronics. Film deposition in such systems is generally accomplished by supporting a substrate within a reactor, flowing a precursor through the reactor and across the substrate, and depositing a film onto the substrate using the precursor flow. The reactor typically maintains environmental conditions and precursor flow pattern within the interior of the reactor suitable for deposition of the film onto the substrate using the precursor flow.

In some reactors, positioning of structures within the reactor is established manually. For example, individual piece parts may be transferred into the reactor sequentially. Once transferred into the reactor each succeeding piece part may further be seated relative to a preceding structure in a registration established from outside of the reactor. While generally satisfactory for their intended purpose, such techniques may be relatively time consuming due to the need to transfer the structures individually into the reactor. Such techniques may also require relatively high level of skill and experience in order to seat the various structures in desired positions. Such techniques may entail risk of injury to the individual performing the transfer and positioning within the reactor. And such techniques may additionally entail risk of damage to the structure themselves and/or the reactor during the transfer, positioning of the various structures within the reactor, and/or repositioning of certain structures within the reactor for matching purposes.

Such systems and have generally been satisfactory for their intended purpose. However, there remains a need in the art for improved fixtures, semiconductor processing systems, and methods of positioning process kit components within reaction chambers of semiconductor processing systems. The present disclosure provides a solution to this need.

SUMMARY OF THE DISCLOSURE

A fixture is provided. A fixture includes a paddle member, a standoff, a slide member, and a male threaded member. The paddle member is arranged along a carrying axis. The standoff is angled relative to a carrying axis and slidably supports the slide member. The male threaded member depends from the slide member and defines a seating axis that is angled relative to the carrying axis. The paddle member is cantilevered from the male threaded member, defines the carrying axis, is fixed relative to the slide member along carrying axis to carry a process kit component into a reaction chamber of a semiconductor processing system, and is free relative to the slide member along the seating axis to seat the process kit component within the reaction chamber of the semiconductor processing system.

In certain examples, a bushing may be seated in the standoff. The bushing may extend about the slide member. The bushing may protrude from the standoff along the carrying axis to limit yaw and pitch of the paddle member.

In certain examples, the slide member may be a first slide member and the fixture may further include a second slide member. The second slide member may be slidably supported by the standoff. The second slide member may be fixed relative to the first slide member to limit roll of the paddle member.

In certain examples, a bumper may be seated in the standoff. The standoff may be parallel to the slide member to limit translation of the paddle member along the carrying axis.

In certain examples, a threaded block may depend from the male threaded member. The threaded block may couple the paddle member to the slide member. The threaded block may be translatable along the seating axis according to rotation of the male threaded member about the seating axis.

In certain examples, a carrying axis position sensor may be operatively associated with the slide member to indicate position of the paddle member along the carrying axis. A seating axis position sensor may be operatively associated with the male threaded member to indicate position of the paddle member along the seating axis.

In certain examples, a droop/inclination pin may be associated with the paddle member to indicate droop and inclination of the paddle member. A droop/inclination controller may be operatively associated with the paddle member to control droop and inclination of the paddle member.

In certain examples, a threaded block may depend from the male threaded member. A guide pin may be fixed relative to the slide member, arranged in parallel with the male threaded member, and slidably received in the threaded block. A pivot bracket may pivotably depend from the threaded block and couple the paddle member to the threaded block.

In certain examples, the pivot bracket may define an indicator slot with an arcuate shape. An indicator pin may be seated in the threaded block and protrude into the indicator slot to indicate inclination of the paddle member.

In certain examples, a trunnion pin may be seated in the threaded block. The trunnion pin may pivotably couple the pivot bracket to the threaded block. A droop/inclination adjustment screw may be threadedly received in the threaded block and abut the pivot bracket. The droop/inclination adjustment screw may abut the pivot bracket at a location offset from at least one of the seating axis and the carrying axis to adjust droop and/or inclination of the paddle member by pivoting the pivot bracket about the trunnion pin.

In certain examples, the paddle member may be a central paddle member with a slot conforming to the process kit component. One or more lateral paddle member may be cantilevered from the threaded member. The one or more lateral paddle member may have a ledge conforming to another process kit component.

In certain examples, the process kit component may be a spider. The spider may be supported on the paddle member.

A susceptor may be seated on the spider and carried therethrough by the paddle member. The susceptor may be registered to the spider to position the susceptor the spider and the susceptor within the reaction chamber with a susceptor/spider registration established outside of the reaction chamber.

In certain examples, the process kit component may be an outer ring. The outer ring may be supported on the paddle member. An intermediate shelf may be seated on the outer ring and carried therethrough by the paddle member. The intermediate shelf may be registered to the outer ring to position the one-piece and the outer ring within the reaction chamber with an intermediate shelf/outer ring registration established outside of the reaction chamber.

A semiconductor processing system is provided. The semiconductor processing system includes a reaction chamber, an injection flange, a process kit component, and a fixture as described above. The reaction chamber has an injection end and an opposite exhaust end. The injection flange is connected to the injection end of the reaction chamber. The standoff is supported by the injection flange and is connected therethrough to the reaction chamber. The process kit component is supported by the paddle member outside of the reaction chamber for carrying and seating of within the reaction chamber using the fixture.

In certain examples, the process kit component may be a singular process kit component.

In certain examples, the process kit component may be a spider and the semiconductor processing system may include a susceptor. The susceptor may be supported by the spider and in registration with the spider for carrying and seating within the reaction chamber in registration with the spider.

In certain examples, the process kit component may be a susceptor and the semiconductor processing system may include an intermediate shelf. The intermediate shelf may be supported by the fixture in registration with the susceptor for carrying and seating within the reaction chamber in registration with the susceptor.

A method of positioning a process kit component within a reaction chamber in a semiconductor processing system is provided. The method includes, at a fixture as described above, fixing the standoff relative to the reaction chamber, supporting a process kit component on the paddle member and carrying the process kit component into the reaction chamber by sliding the slide member through the standoff such that sliding of the slide member translating the paddle member along the carrying axis. The process kit component is then within the reaction chamber using rotation of the male threaded member, rotation of the male threaded member translating the paddle member along the seating axis.

In certain examples, the method may include registering an intermediate shelf to the susceptor, supporting the intermediate shelf on the fixture, and carrying the intermediate shelf into the reaction chamber in registration with the susceptor. The susceptor and the intermediate shelf are seated within the reaction chamber with an intermediate shelf/susceptor registration established outside of the reaction chamber.

In certain examples, the method may include indicating inclination of the paddle member with an inclination indicator operatively associated with paddle member and adjusting inclination of paddle member with a droop/inclination adjustment screw operatively connected to the paddle member.

In certain examples, the method may include indicating a carrying axis position of the paddle member along the carrying axis with a carrying axis position sensor coupled to the slide member, indicating a seating axis position of the paddle member along the seating axis with a seating axis position sensor coupled to the male threaded member, and matching position of the process kit component within reaction chamber to another reaction chamber using at least one of (a) the carrying axis position indicated by the carrying axis position sensor, and (b) the seating axis position indicated by the seating axis position sensor.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the present disclosure are described below with reference to the drawings of certain examples, which are intended to illustrate and not to limit the invention.

Figure 1:
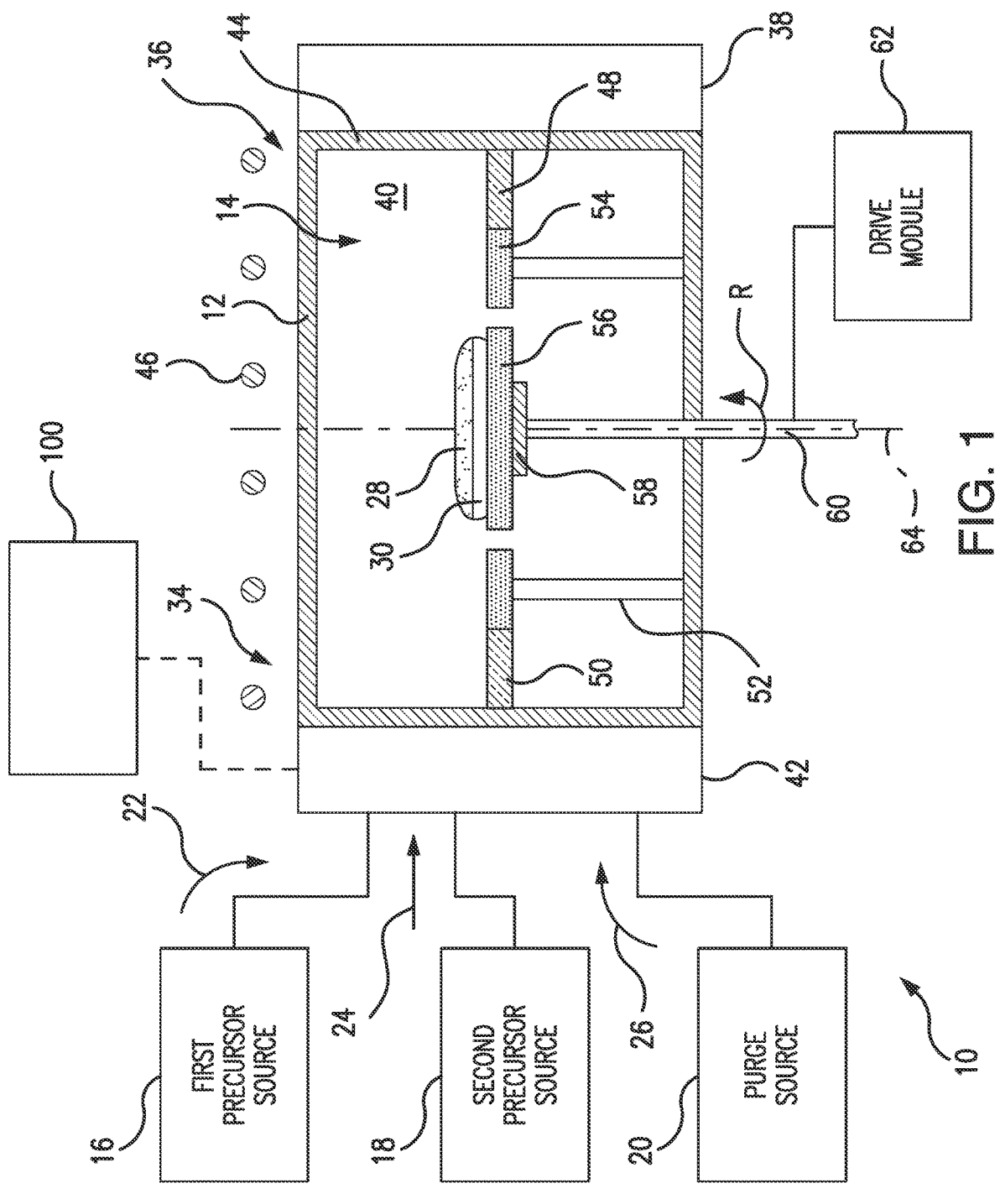
FIG. 1 is a schematic view of a fixture for positioning process kit components within a reaction chamber of a semiconductor processing system in accordance with the present disclosure, showing the fixture exploded away from the reaction chamber of the semiconductor processing system.
Figures 11A, 11B, 11C, 11D:
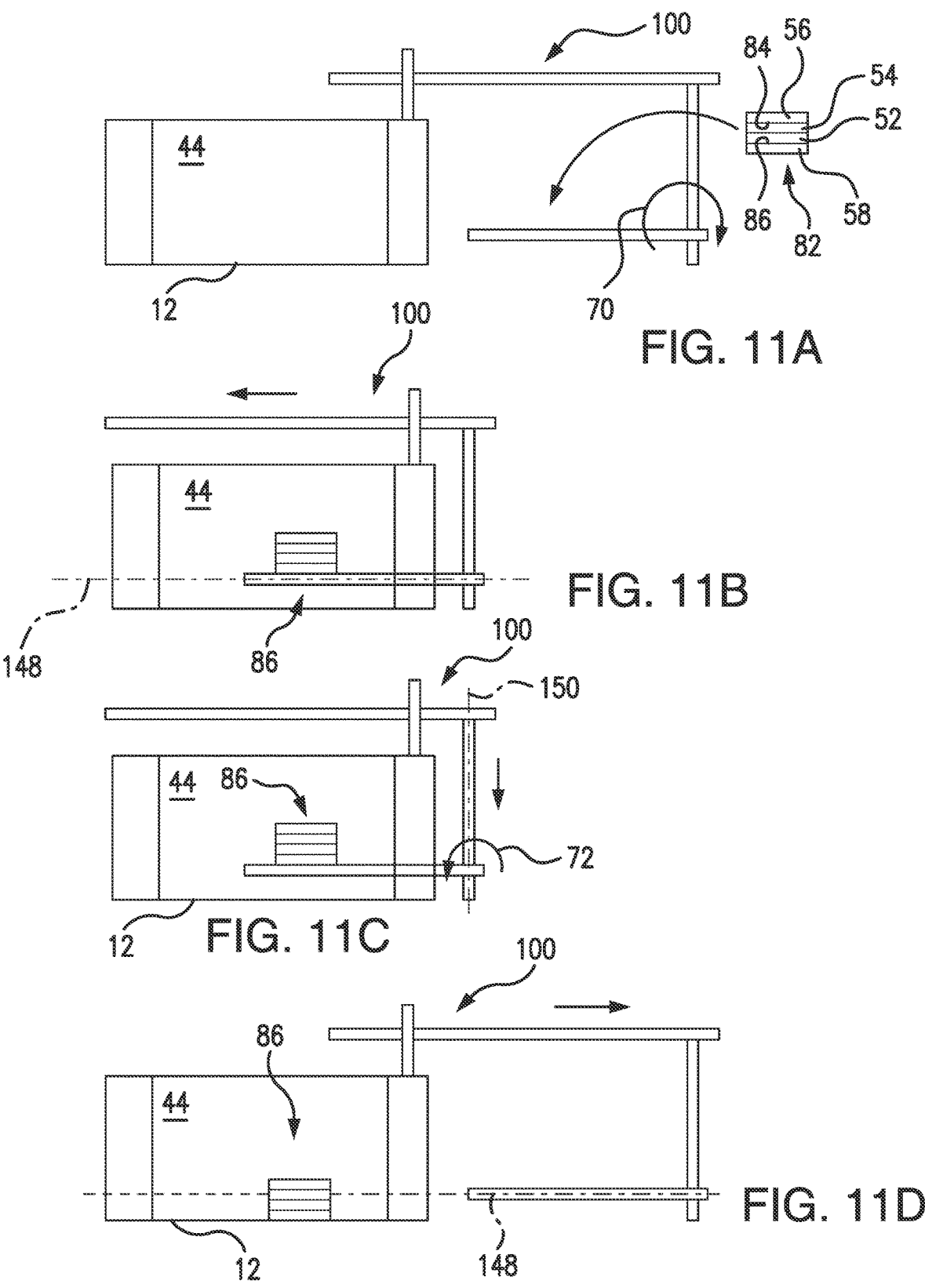
Figure 12:
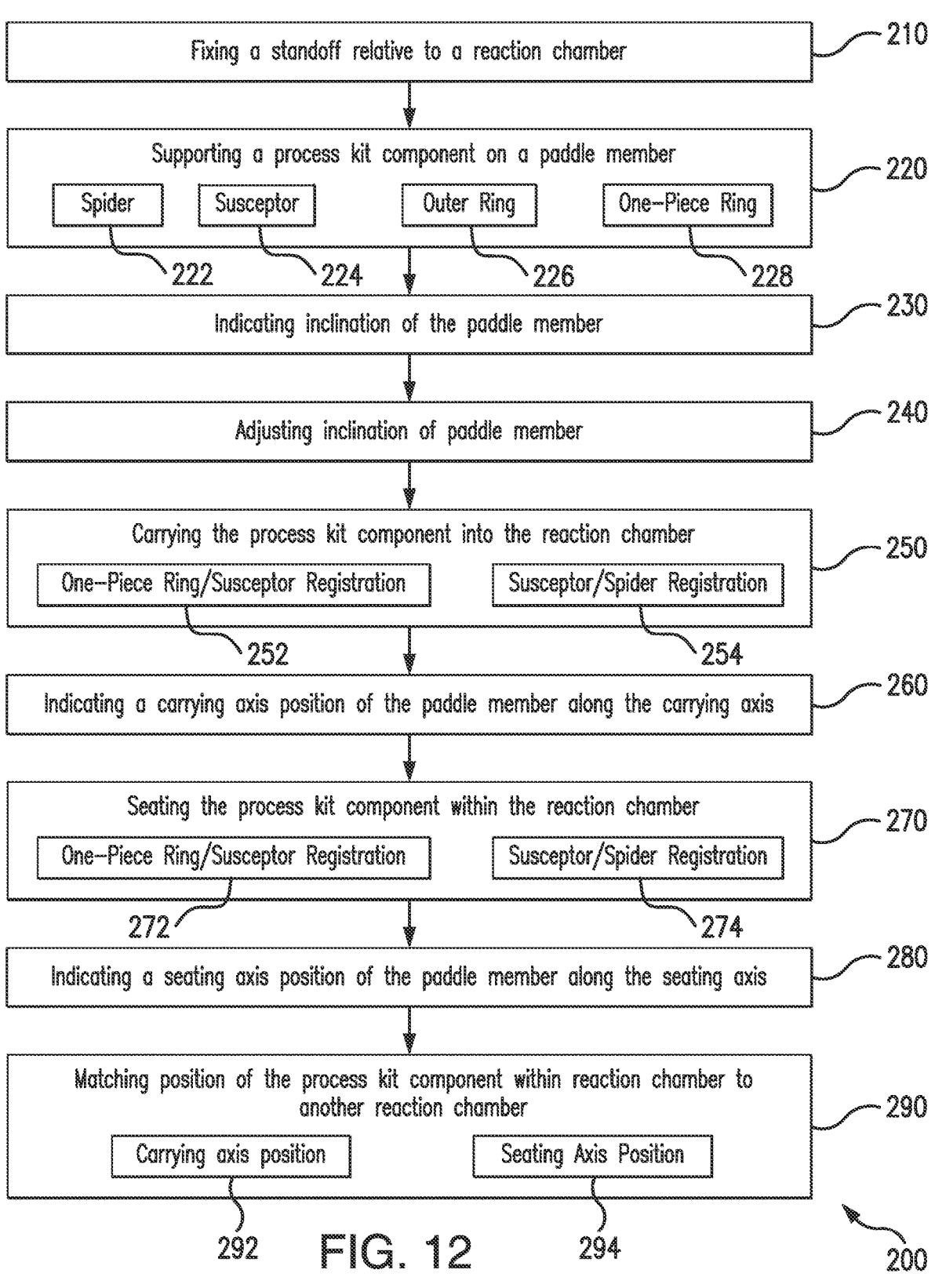

FIGS. 11A-11D are side views of the reaction chamber and the fixture of FIG. 1, schematically showing the fixture carrying and seating four process kit components within the reaction chamber using registrations established outside of the reaction chamber; and FIG. 12 is a block diagram of a method of positioning a process kit component within a reaction chamber of a semiconductor processing system, showing operations of the method according to an illustrative and non-limiting example of the method.

It will be appreciated that elements in the figures are illustrated for simplicity and clarity and have not necessarily been drawn to scale. For example, the dimensions of some of the elements in the figures may be exaggerated relative to other elements to help improve understanding of illustrated examples of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a fixture in accordance with the disclosure is shown in FIG. 1 and is designated generally by reference character 100. Other examples of fixtures, semiconductor processing systems, and methods of positioning process kit components within reaction chambers of semiconductor processing systems in accordance with the present disclosure, or aspects thereof, are provided in FIGS. 2-12, as will be described. The fixtures, semiconductor processing systems, and methods of positioning process kit components within reaction chambers of semiconductor processing systems can be used position process kit components within reaction chambers employed for depositing films onto substrates, such as atmospheric chemical vapor deposition (CVD) systems employed for epitaxial film deposition, though the present disclosure is not limited to any particular type of semiconductor processing system or to epitaxial film deposition techniques in general.

Referring to FIG. 1, a semiconductor processing system 10 is shown. The semiconductor processing system includes a reaction chamber 12 housing a process kit component 14, a first precursor source 16, a second precursor source 18, and a purge source 20. The first precursor source 18 is connected to the reaction chamber 12 and is configured to provide a first precursor 22 to the reaction chamber 12. The second precursor source 18 is also connected to the reaction chamber 12 and is configured to provide a second precursor 24 to the reaction chamber 12. The purge source 20 is further connected to the reaction chamber 12 to provide a purge or carrier gas 26 to the reaction chamber 12. In certain examples, the first precursor 22 may include a silicon-containing precursor selected to epitaxially deposit a silicon-containing film 28 onto a substrate 30 supported with the reaction chamber 12. In accordance with certain examples, the second precursor 24 may include a dopant-containing precursor, such as a germanium-containing precursor, for inclusion within the film 28. It is contemplated that, in accordance with certain examples, that the purge or carrier gas may include hydrochloric acid or hydrogen gas, such as for etching walls and/or controlling deposition of the film 28 onto the substrate 30.

The reaction chamber 12 has an elongated body 32, an open injection end 34, and an open exhaust end 36 longitudinally opposite the open injection end 34. An exhaust flange 38 is connected to the exhaust end 36 of the reaction chamber 12 and is configured to fluidly couple an interior 40 of the reaction chamber 12 to an exhaust source, e.g., a scrubber. An injection flange 42 is connected to the injection end 34 of the reaction chamber 12, the injection flange 42 fluidly coupled to the exhaust flange 38 by the interior 40 of the reaction chamber 12, and the injection flange 42 fluidly coupling the first precursor source 16, second precursor source 18, and the purge source 20 to the reaction chamber 12. In certain examples, the reaction chamber 12 may be formed from a transmissive material 44, such as quartz. In accordance with certain examples, one or more heat lamp 46 may be radiantly coupled to the interior 40 of the reaction chamber 12 for heating the substrate 30 during deposition of the film 28 onto a surface of the substrate 30. The injection flange 42 may be as shown and described in U.S. Patent Application Publication No. 2020/0224309 A1 to Sreeram et al., published on Jul. 16, 2020, the contents of which are incorporated herein by reference in their entirety.

The process kit component 14 is positioned within the interior 40 of the reaction chamber 12. In certain examples, the process kit component 14 may be an exhaust end shelf 48. In accordance with certain examples, the process kit component 14 may be an injection end shelf 50. In further examples, the process kit component 14 may be an outer ring 52 or an intermediate shelf 54. In accordance with certain examples, the process kit component 14 may be a susceptor 56. It is contemplated that, in accordance with certain examples, the process kit component may be a spider 58. It is contemplated that the spider 58 be configured to couple the susceptor 56 to a shaft 60, that the shaft 60 in turn couple the spider 58 and the therethrough the susceptor 56 to a drive module 62, and the drive module 62 be configured to rotate R the susceptor 56 about a rotation axis 64 during deposition of the film 28 onto the substrate 30. In this respect the reaction chamber 12 and the process kit component 14 may be as shown and described in U.S. Pat. No. 7,108,753 to Wood, issued on Sep. 19, 2006, and U.S. Pat. No. 6,086,680 to Foster et al., issued on Jul. 11, 2000, the contents of which are incorporated herein by reference in their entirety. Although particular examples of the process kit component 14 are shown and described herein, it is to be understood and appreciated that other types of process kit components and methods may also benefit from the present disclosure.

As has been explained above, positioning the process kit components within reaction chambers may require negotiating architectural features of the reaction chamber. For example, with respect to the reaction chamber 12, positioning the process kit component 14 within the reaction chamber 12 generally entails inserting the process kit component through one of the open ends of the reaction chamber 12. Once within the reaction chamber 12, the process kit component 14 may require further manipulation within the interior 40 of the reaction chamber 12 to reach its desired position. In some reaction chambers, maneuvering the process kit component may require avoiding contact between the process kit component and interior surfaces of the reaction chamber to avoid damaging the reaction chamber, such as scratching interior surfaces and/or generating particulate contamination from inadvertent component contact within the reaction chamber. Further, the process kit component may require manipulation to reach a desired as-built position from a built-to-print position, such as for performance matching among reaction chambers. And positioning process kit components may require taking precautions to limit risk of injury to the technician positioning the process kit component within the reaction chamber, such as due to the spatial constraints and interferences within the reaction chamber. To facilitate positioning the process kit component 14 within the reaction chamber 12, limit (or eliminate) risk of injury to the individual(s) positioning the process kit component 14 within the reaction chamber 12, limit (or eliminate) probability of damage to the reaction chamber 12 during positioning of the process kit component 14 within the reaction chamber 12, and/or control position of the process kit component 14 within the interior 40 of the reaction chamber 12, the fixture 100 is provided.

Figure 2:
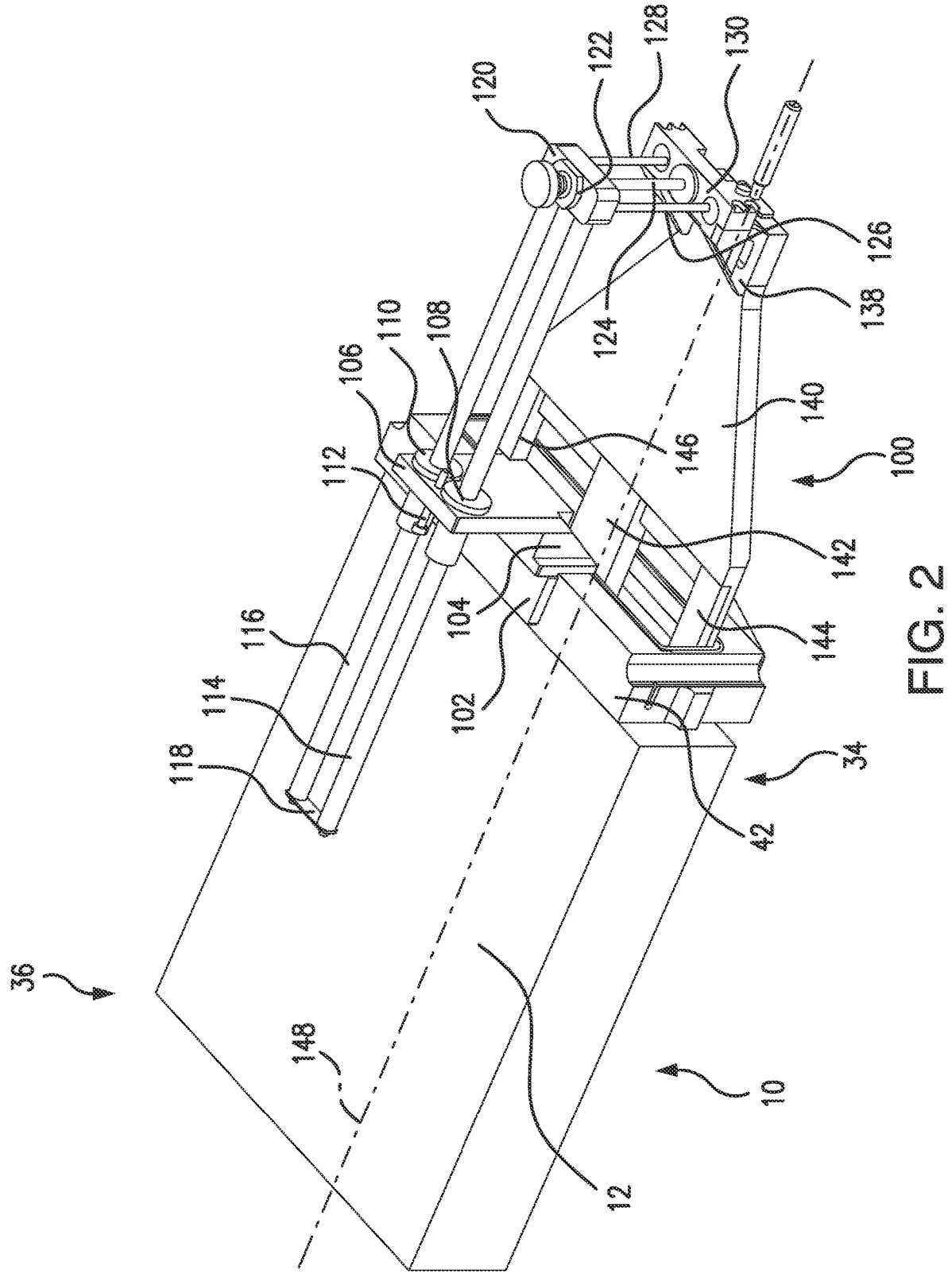
FIG. 2 is a perspective view of the fixture and the reaction chamber of FIG. 1 according to an example, showing the fixture supported by an injection flange through a standoff and connected therethrough to the reaction chamber.

With reference to FIG. 2, the reaction chamber 12, the injection flange 42, and the fixture 100 are shown. In the illustrated example, the fixture 100 includes a standoff plate 102, a standoff bracket 104, a standoff 106, a first bushing 108, and a second bushing 110. The fixture 100 also includes a bumper 112, a first slide member 114, a second slide member 116, an end plate 118, and an end block 120. The fixture 100 further includes a bearing arrangement 122, a male threaded member 124, a first guide pin 126, a second guide pin 128, and a threaded block 130. The fixture 100 additionally includes a trunnion pin 132 (shown in FIG. 6), a droop/inclination indicator 134 (shown in FIG. 6), a droop/inclination controller 136 (shown in FIG. 6), and a pivot bracket 138, and a cantilevered plate 140. As also shown in FIG. 2, the fixture 100 includes a central paddle member 142, a first lateral paddle member 144, and a second lateral paddle member 146.

The fixture 100 is fixed relative to the reaction chamber 12 and is arranged along a carrying axis 148. The carrying axis 148 extends through the injection flange 42 and the reaction chamber 12 and spans the injection end 34 and exhaust end 36 of the reaction chamber 12. Fixation of the fixture 100 relative to the reaction chamber 12 is accomplished by the standoff plate 102, which is connected to the injection flange 42 and is substantially orthogonal relative to the carrying axis 148 The standoff bracket 104 depends from the standoff plate 102, is cantilevered from the standoff plate 102 along the carrying axis 148 in a direction opposite the reaction chamber 12, and supports the standoff 106. The standoff 106 is angled relative to the carrying axis 148 and is arranged above the reaction chamber 12. As will be appreciated by those of skill in the art in view of the present disclosure, fixation via the injection flange 42 limits load exerted on the reaction chamber 12 during positioning of the process kit component 14 within the reaction chamber 12.

Figure 3:
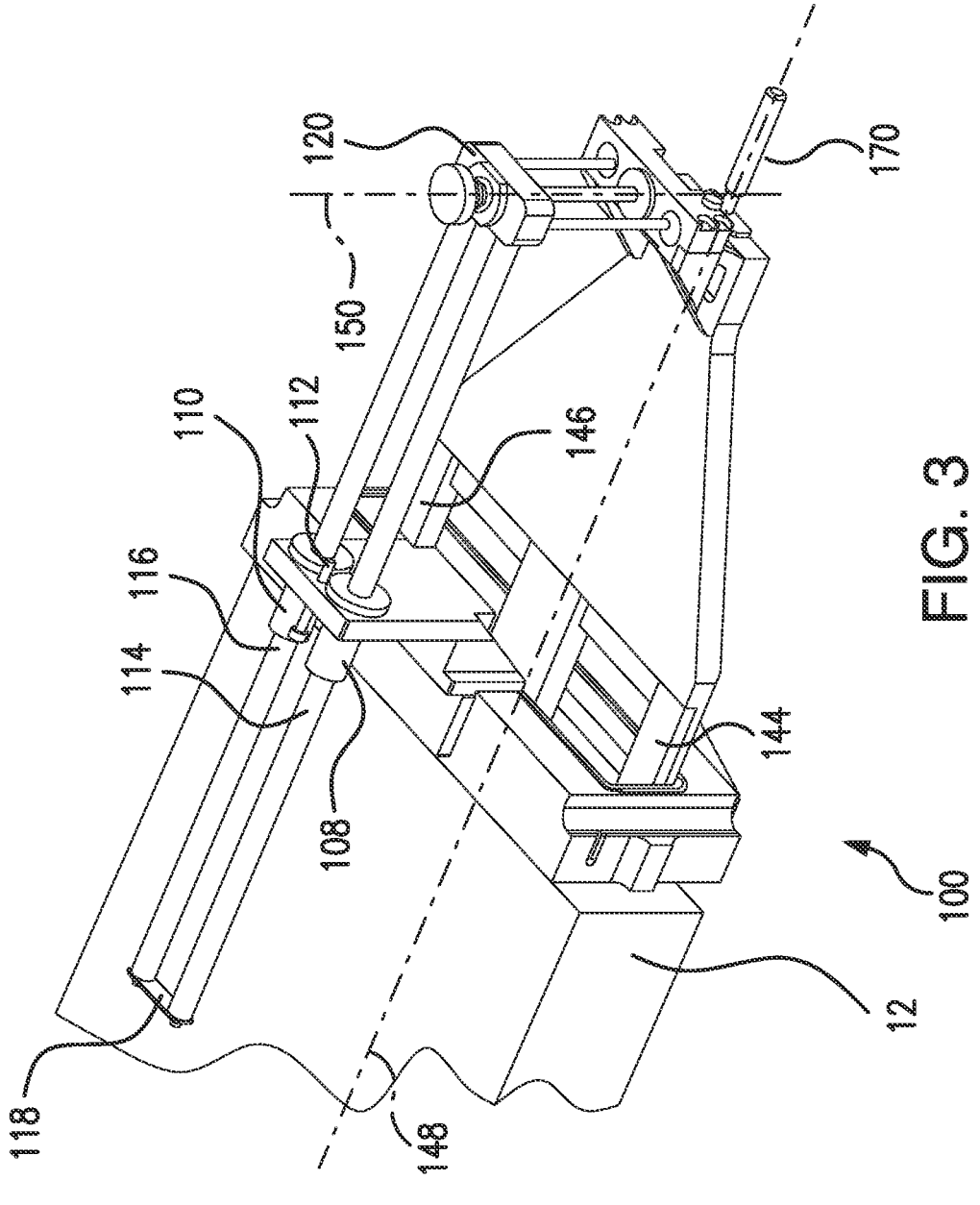
FIG. 3 is a perspective view of a portion of the fixture and reaction chamber of FIG. 1 according to the example, showing first and second slide members of the fixture slidably supported by the standoff for carrying process kit components into the reaction chamber.

With reference to FIG. 3, the first bushing 108 and the second bushing 110 are seated in the standoff 106. The first bushing 108 extends in parallel with the carrying axis 148 and is elongated with respect to an axial width of the standoff 106. The first bushing 108 further protrudes from the standoff 106 in at least one direction along the carrying axis 148 to limit yaw and pitch of the paddle member, e.g., one or more of the central paddle member 142, the first lateral paddle member 144, and/or the second lateral paddle member 146, during movement within the reaction chamber 12. The second bushing 110 is similar to the first bushing 108, is parallel to the first bushing 108, and is spaced apart from the first bushing 108 such that each of offset from the carrying axis 148 by a common offset distance.

The first slide member 114 is slidably received in the first bushing 108 and is translatable relative to the first bushing 108 along the carrying axis 148. The second slide member 116 is slidably received in the second bushing 110, is translatable relative to the second bushing 110 along the carrying axis 148. It is contemplated that the second slide member 116 be parallel to the first slide member 114 and fixed in relation to the first slide member 114, the first slide member 114 and the second slide member 116 thereby translatable in concert with one another along the carrying axis 148 through the first bushing 108 and the second bushing 110, respectively. As will be appreciated by those of skill in the art in view of the present disclosure, the support provided by the elongated length of the first bushing 108 and/or the second bushing 110 may limit roll of the paddle member, e.g., one or more of the central paddle member 142, the first lateral paddle member 144, and the second lateral paddle member 146, during movement within the reaction chamber 12. In the illustrated example, the second slide member 116 is fixed to the first slide member 114 by the end plate 118 and the end block 120, the end plate 118 fixing inboard ends of the first slide member 114 and the second slide member 116 to one another above the reaction chamber 12, and the end block 120 fixing opposite outboard ends of the first slide member 114 and the second slide member 116 to one another on side of the standoff 106 opposite the end plate 118.

The bumper 112 is seated in the standoff 106 between the first slide member 114 and the second slide member 116, protrudes from the standoff 106 along the carrying axis 148 toward the end block 120. The end block 120 axially overlaps the standoff 106, the bumper 112 thereby limiting translation of the first slide member 114 and the second slide member 116 along the carrying axis 148 within the reaction chamber 12. It is contemplated that the bumper 112 from the standoff 106 by a bumper length selected to limit travel of the first slide member 114 and the second slide member 116 along the carrying axis 148. In certain examples, the bumper length is selected to prevent ends of one or more of the central paddle member 142 (shown in FIG. 7), the first lateral paddle member 144 (shown in FIG. 7), and the second lateral paddle member 146 (shown in FIG. 7) from contacting the exhaust end 36 (shown in FIG. 1) and/or exhaust flange 38 (shown in FIG. 1) during carrying and/or positioning of the process kit component 14 (shown in FIG. 1) within the reaction chamber 12.

Figure 4:
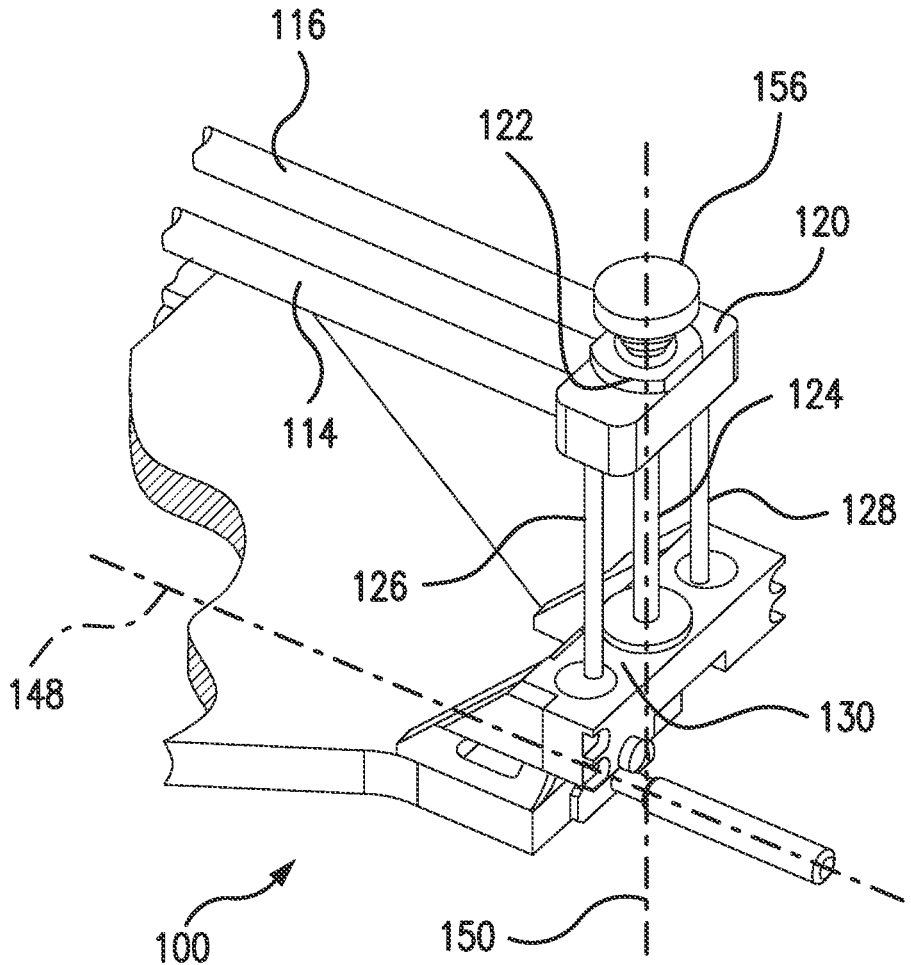
FIG. 4 is a perspective view of a portion of the fixture and reaction chamber of FIG. 1 according to the example, showing a male threaded member depending from the first and second slide members for seating process kit components within the reaction chamber.

With reference to FIG. 4, the end block 120 depends from outboard ends of the first slide member 114 and the second slide member 116 and seats the bearing arrangement 122, the first guide pin 126, and the second guide pin 128. The male threaded member 124 depends from the end block 120 along a seating axis 150, and therethrough depends from the first slide member 114 and the second slide member 116. The male threaded member 124 is further angled relative to the first slide member 114 and the second slide member 116, extends vertically between the end block 120 and the carrying axis 148, and has male threads 152 (shown in FIG. 5). The first guide pin 126 and the second guide pin 128 similarly depend from the end block 120, the first guide pin 126 extending in parallel with the male threaded member 124, and the second guide pin 128 extending in parallel with the first guide pin 126 and on a side of the male threaded member 124 opposite the first guide pin 126. It is contemplated that a seating knob 154 be operably connected to the male threaded member 124 for rotating the male threaded member 124 about the seating axis 150.

Figure 5:
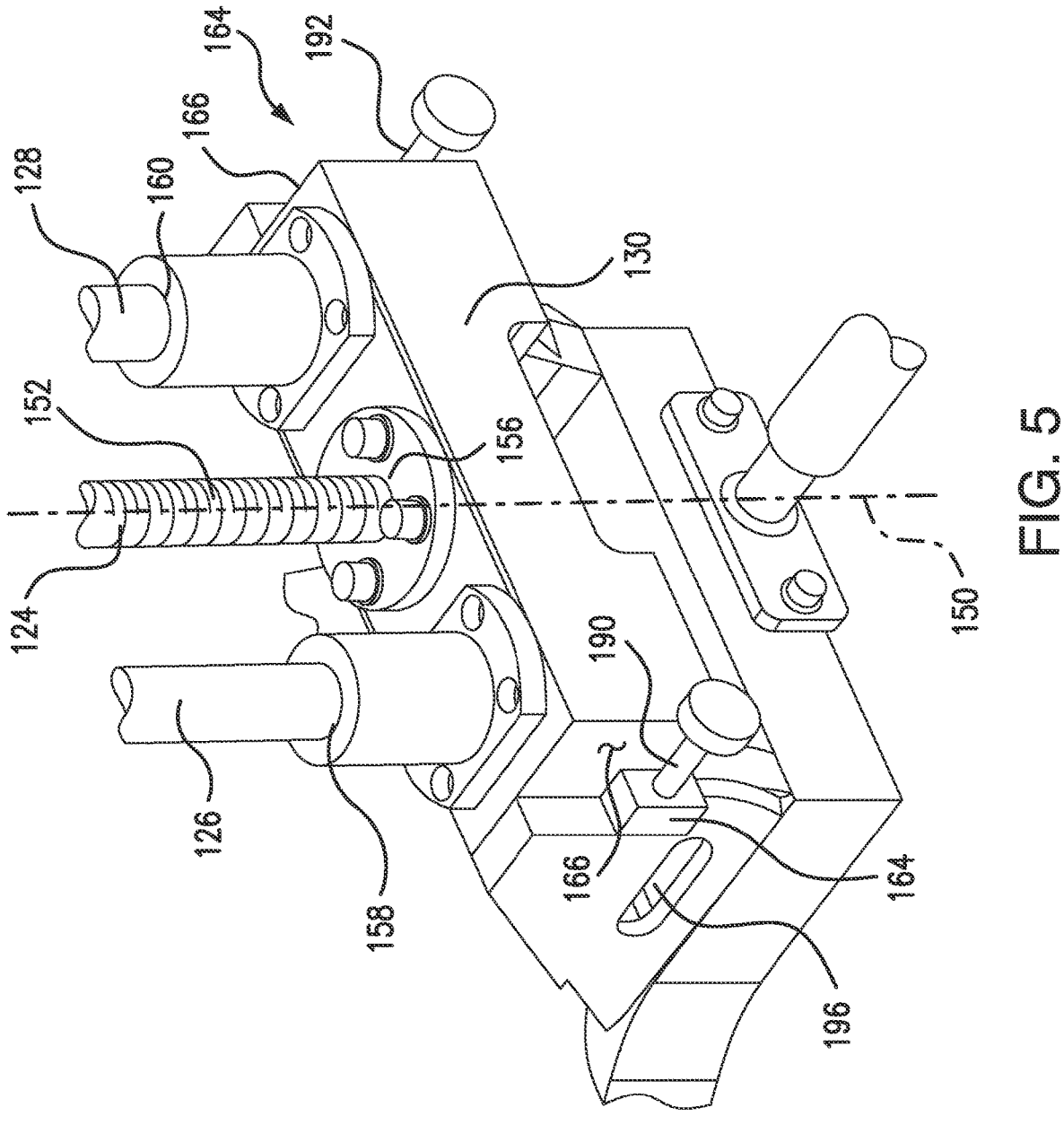
FIGS. 5 and 6 are perspective and side views of a portion of the fixture of FIG. 1 according to the example, showing a droop/inclinator and a droop/inclination controller for indicating and controlling droop and inclination of paddle members of the fixture.

With reference to FIG. 5, the threaded block 130 depends from the male threaded member 124. In this respect the threaded block 130 has a female threaded aperture 156 with female threads therein, receives the male threaded member 124 in the female threaded aperture 156, and is threadedly engaged to the male threads 152 of the male threaded member 124 via the female threaded aperture 156. The threaded block 130 further has a first guide pin aperture 158 and a second guide pin aperture 160, the first guide pin 126 slidably received in the first guide pin aperture 158, and the second guide pin 128 slidably received in the second guide pin aperture 160. It contemplated that the first guide pin 126 and the second guide pin 128 cooperate with the male threaded member 124 such that rotation of the male threaded member 124 about the seating axis 150 translates the threaded block 130 along the seating axis 150, e.g., toward or away from the carrying axis 148. In certain examples, the threaded block 130 and the threaded member 124 may include a linear actuator, such as a ball-screw assembly by way of non-limiting example.

Figure 6:
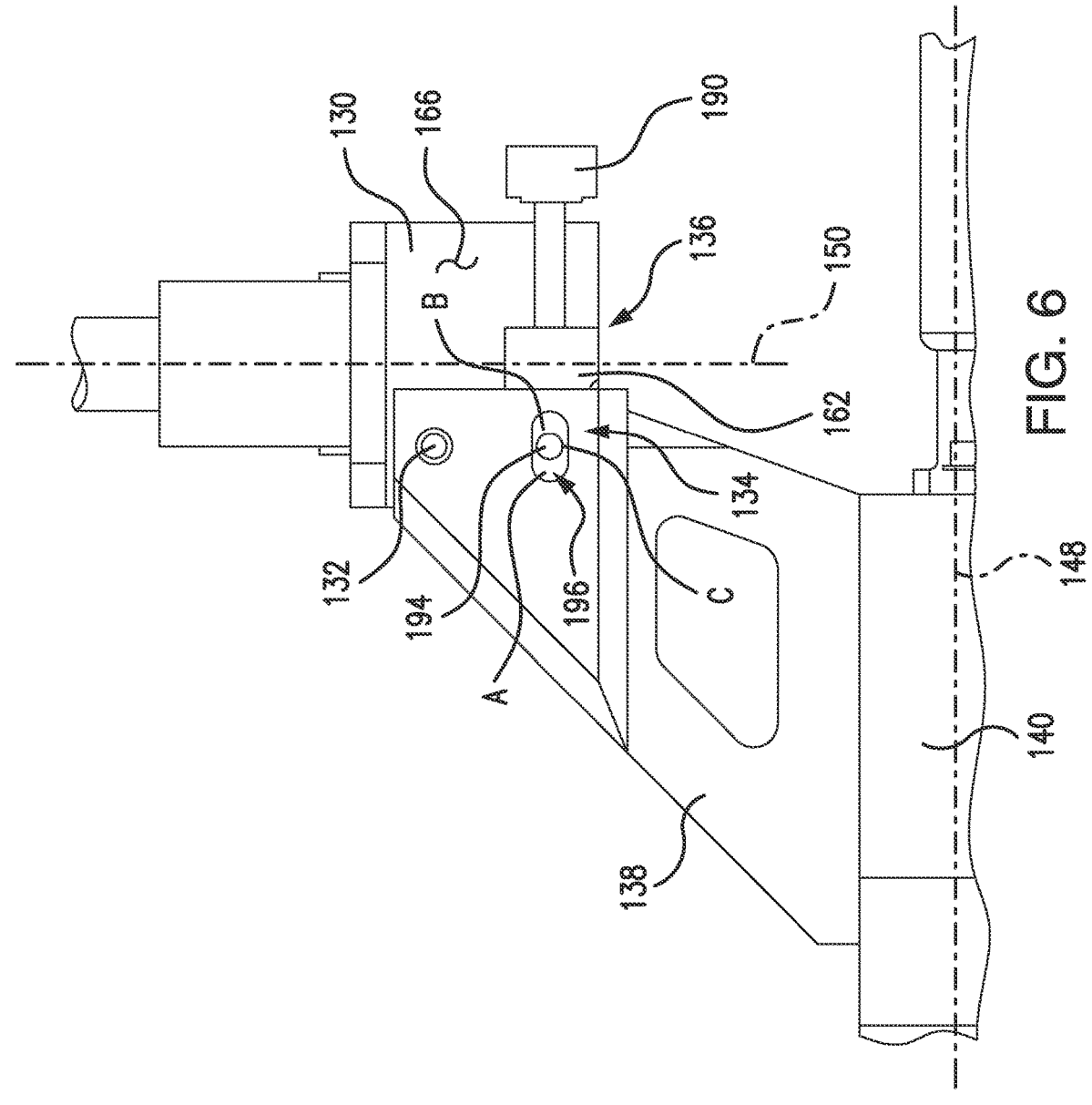

With reference to FIG. 6, the trunnion pin 132 is seated in threaded block 130. In this respect ends of the trunnion pin 132 protrudes from the threaded block 130 at a location offset from the from the seating axis 150 and is positioned between the male threaded member 124 and the end plate 118 (shown in FIG. 2). The pivot bracket 138 depends from the trunnion pin 132, is pivotably supported by the trunnion pin 132, and couples the cantilevered plate 140 to the threaded block 130 through the trunnion pin 132. The pivot bracket 138 further extends along the carrying axis 148 from the threaded block 130 toward the end plate 118 (shown in FIG. 2). It is contemplated that the pivot bracket 138 abut a first pivot stop 162 and a second pivot stop 164 (shown in FIG. 5) protruding from a first lateral face 166 and the second lateral face 168 (shown in FIG. 5) of the threaded block 130, the first pivot stop 162 and the second pivot stop 164 pivotably constraining the pivot bracket 138 in rotation about the trunnion pin 132.

Figure 7:
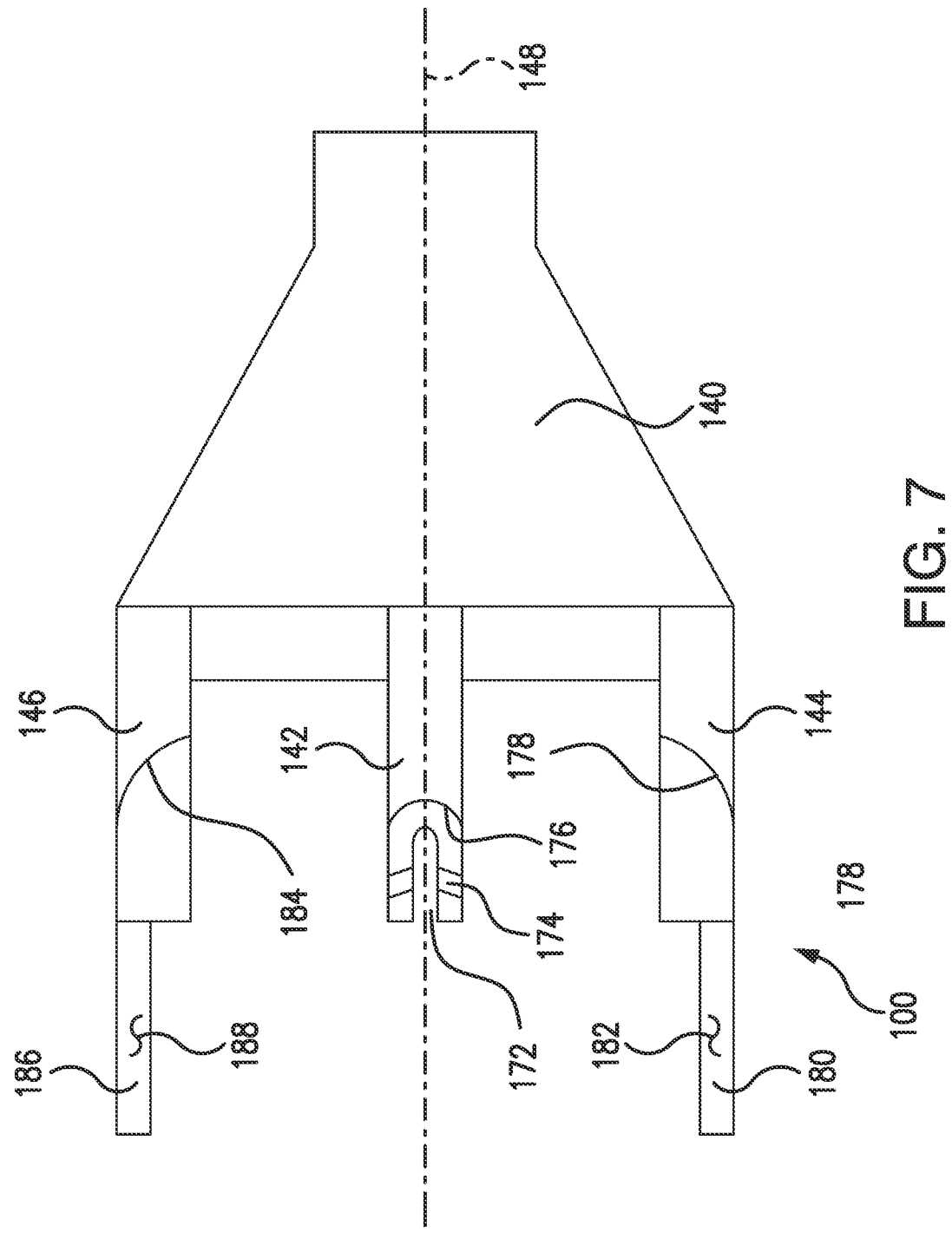
FIG. 7 is a plan view of a portion of the fixture of FIG. 1 according to the example, showing central and lateral paddle members of the fixture for carrying and seating process kit components within the reaction chamber.

With reference to FIG. 7, the cantilevered plate 140 depends from the pivot bracket 138 (shown in FIG. 2) and extends along the carrying axis 148 from the pivot bracket 138 toward the end plate 118 (shown in FIG. 2). The cantilevered plate 140 further couples one or more paddle members, e.g., the central paddle member 142, the first lateral paddle member 144, and the second lateral paddle member 146, to the pivot bracket 138. It is contemplated that the one or more paddle member extend along the carrying axis 148 from the cantilevered plate 140 toward the end plate 118, be fixed relative to the first slide member 114 (shown in FIG. 2) and the second slide member 116 (shown in FIG. 2) along the carrying axis 148, and be free relative to the first slide member 114 and the second slide member 116 along the seating axis 150 (shown in FIG. 4).

The central paddle member 142 is configured to support the process kit component 14 (shown in FIG. 1). In this respect the central paddle member 142 is connected to the cantilevered plate 140 on an outboard end, defines the carrying axis 148, and extends along the carrying axis 148 toward the end plate 118 (shown in FIG. 2). In certain examples, the central paddle member 142 may be configured to support the spider 58 (shown in FIG. 1). In such examples the central paddle member 142 may have and axial slot 172 and/or an oblique slot 174, the axial slot 172 conforming to a shank of the spider 58 and the oblique slot 174 conforming to an arm of the spider 58. In accordance with certain examples, the central paddle member 142 may be configured to support the susceptor 56 (shown in FIG. 1). In such examples the central paddle member 142 may have a central ledge 176 conforming to the susceptor 56 for supporting the susceptor 56, either singularly or in registration with the spider 58 while supported (at least in part) by the spider 58.

The first lateral paddle member 144 is also configured to support the process kit component 14 (shown in FIG. 1). In this respect the first lateral paddle member 144 is connected to the cantilevered plate 140 on an outboard end, is laterally offset from the central paddle member 142 and the carrying axis 148 and extends along the carrying axis 148 towards the end plate 118 (shown in FIG. 2). In certain examples, the first lateral paddle member 144 may be configured to support the intermediate shelf 54 (shown in FIG. 1). In such examples the first lateral paddle member 144 may have a first lateral ledge 178 conforming to a periphery of the intermediate shelf 54 for supporting the intermediate shelf 54. In such examples the first lateral ledge 178 may be located in relation to the central paddle member 142 such that the intermediate shelf 54 is supported in registration relative to the susceptor 56 (shown in FIG. 1). In accordance with certain examples, a first tine member 180 member may be connected to the first lateral paddle member 144. In such examples the first tine member 180 may have a first tine surface 182 conforming to a lower surface of one or more of the outer ring 52 (shown in FIG. 1), the injection end shelf 50 (shown in FIG. 1), and/or the exhaust end shelf 48 (shown in FIG. 1) to support the process kit component thereon.

The second lateral paddle member 146 is similarly configured to support the process kit component 14 (shown in FIG. 1). In this respect second lateral paddle member 146 is connected to the cantilevered plate 140 on an outboard end, is laterally offset from the central paddle member 142 and the carrying axis 148 on side of the central paddle member 142 laterally opposite the first paddle member 144 and extends along the carrying axis 148 towards the end plate 118 (shown in FIG. 2). In certain examples, the second lateral paddle member 146 may also be configured to support the intermediate shelf 54 (shown in FIG. 1). In such examples the second lateral paddle member 146 may have a second lateral ledge 184 conforming to a periphery of the intermediate shelf 54 for supporting the intermediate shelf 54, the second lateral ledge 184 mirroring the first lateral ledge 178 about the carrying axis 148. In accordance with certain examples, a second tine member 186 member may be connected to the second lateral paddle member 146. The second tine member 186 may have a second tine surface 188 also conforming to a lower surface of one or more of the outer ring 52 (shown in FIG. 1), the injection end shelf 48 (shown in FIG. 1), and/or the exhaust end shelf 50 (shown in FIG. 1) to support the process kit component thereon.

As will be appreciated by those of skill in the art in view of the present disclosure, the cantilevered support provided by the cantilevered plate 140 to the process kit component 14 (shown in FIG. 1) urges the pivot bracket 138 (shown in FIG. 2) pivotably about the trunnion pin 132 due to gravity. In certain examples, load transferred through the cantilevered plate 140 may, in cooperation with the axial length(s) of the paddle member, cause the paddle members to droop with respect to gravity. To control such droop, as well as inclination, the fixture 100 (shown in FIG. 1) includes the droop/inclination controller 136 (shown in FIG. 6) and the droop/inclination indicator 134 (shown in FIG. 6).

With continuing reference to FIG. 6, the droop controller 136 is associated with a paddle member of the fixture 100 (shown in FIG. 1), e.g., one or more of the central paddle member 142 (shown in FIG. 2), the first lateral paddle member 144 (shown in FIG. 2), and/or second lateral paddle member 146 (shown in FIG. 2), for adjusting droop and inclination of the paddle member. In the illustrated example, the droop controller 136 is operative to pivot the pivot bracket 138 about the trunnion pin 132 is a direction opposite gravity and includes a first droop/inclination adjustment screw 190 and a second droop/inclination adjustment screw 192 (shown in FIG. 5). Pivoting is accomplished via the first droop/inclination adjustment screw 190, which is threadedly received in the first pivot stop 162 at a location along the seating axis 150 between the trunnion pin 132 and the cantilevered plate 140, extends axially along the carrying axis 148, and abuts the pivot bracket 138. So arranged, advancing the first droop/inclination adjustment screw 190 along the carrying axis 148, i.e., in an inboard direction towards the end plate 118, decreases droop (or increases inclination) of the cantilevered plate 140 and the paddle member(s) attached thereto. Oppositely, withdrawing the first droop/inclination adjustment screw 190 along the carrying axis 148, in an outboard direction away from the carrying plate 118, decreases inclination (or increases droop) of the cantilevered plate 140 and the paddle member(s) attached thereto.

The second droop/inclination adjustment screw 192 is similar to the first droop/inclination adjustment screw 190, is additionally threadedly received in the second pivot stop 164 (shown in FIG. 5). More specifically, the second droop/inclination adjustment screw 192 is threadedly received in the second pivot stop 164 at a location along the seating axis 150 between the trunnion pin 132 and the cantilevered plate 140, extends axially along the carrying axis 148, and abuts the pivot bracket 138 such that advancement of the second droop/inclination adjustment screw 192 decreases droop (or increases inclination) of the cantilevered plate 140, and withdrawal of the second droop/inclination adjustment screw 192 decreases inclination (or increases droop) of the cantilevered plate 140. Notably, while the second droop/inclination adjustment screw 192 may cooperate with the first droop/inclination adjustment screw 190, it is also contemplated that the second droop/inclination adjustment screw 192 may operate in opposition to the first droop/inclination adjustment screw 190, e.g., to induce yaw in the cantilevered plate 140 relative to the reaction chamber 12. As will be appreciated by those of skill in the art in view of the present disclosure, such yaw may be required when the process kit component 14 need be seated within the reaction chamber 12 in a position matching the as-built position of a similar process kit component in an otherwise identical reaction chamber, the as-built position differing from a built-to-print position of the similar process kit component in the otherwise identical reaction chamber. In certain examples, droop controller 136 may provide between about +/−45 degrees of droop/inclination in the paddle member(s) coupled to the threaded block 130 through the cantilevered plate 140.

The droop/inclination indicator 134 is associated with one or more paddle member of the fixture 100 (shown in FIG. 1), e.g., the central paddle member 142 (shown in FIG. 2), the first lateral paddle member 144 (shown in FIG. 2), and/or the second lateral paddle member 146 (shown in FIG. 2), to indicate droop or inclination of the paddle member. In the illustrated example, droop/inclination indicator 134 includes an indicator pin 194, first arcuate slot 196, and a second arcuate slot 198 (shown in FIG. 5) laterally opposite the first arcuate slot 196. The first arcuate slot 196 and the second arcuate slot 198 extend through the pivot bracket 138, are convex in shape, and extend along the carrying axis 148. The indicator pin 194 is seated in the threaded block 130 at a location along the seating axis 150 between the trunnion pin 132 and the cantilevered plate 140, shares a common axial position with the trunnion pin 132 along the carrying axis

148, and protrudes on opposite ends into both the first arcuate slot 196 and the second arcuate slot 198 to indicate droop or inclination of the cantilevered plate 140.

It is contemplated that the protruding opposite ends of the indicator pin 194 be disposed within the first arcuate slot 196 and the second arcuate slot 198 to indicate droop or inclination of the cantilevered plate 140 (and the paddle member(s) connected thereto). For example, disposal of a protruding end of the indicator pin 196 in an inboard portion A of the first arcuate slot 196 indicates that the cantilevered plate 140 and paddle members(s) attached thereto are inclined relative to gravity. Disposal of the protruding end of the indicator pin 194 in an outboard portion B of the first arcuate slot 196 indicates that the cantilevered plate 140 and paddle members(s) attached thereto are drooping relative to gravity. Disposal of the protruding end of the indicator pin 194 in the minima of the first arcuate slot 196 indicates that the cantilevered plate 140 is level, i.e., is neither drooping nor inclined, relative to gravity. As will be appreciated by those of skill in the art in view of the present disclosure, controlling droop and/or inclination may limit risk of damage during positioning of the process kit component 14 (shown in FIG. 1) within the reaction chamber, for example, by limiting (or eliminating) risk that a paddle member contact an interior surface of the reaction chamber 12 (shown in FIG. 1). In certain examples, the convex shape of the first arcuate slot 196 and the second arcuate slot 198 corresponds to a paddle droop/inclination range of about +/−45 degrees.

Figure 8:
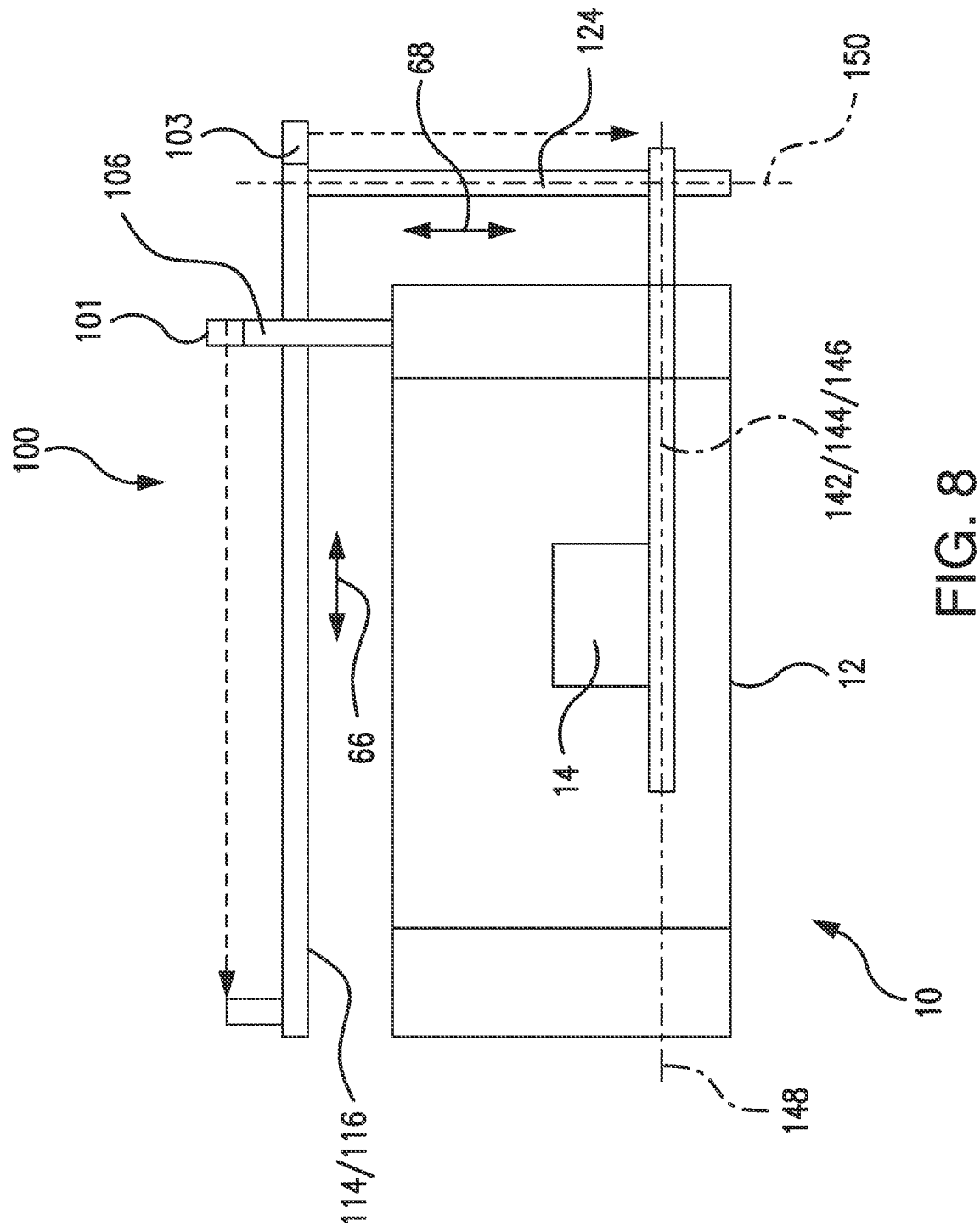
FIG. 8 is a side view of the reaction chamber and fixture of FIG. 1, schematically showing a carrying axis position sensor and a seating axis position sensor for indicating position of the process kit components along a carrying axis and a seating axis during carrying and seating of process kit components within the reaction chamber.

With reference to FIG. 8, a carrying axis sensor 101 and a seating axis sensor 103 are shown. The carrying axis sensor 101 is configured to indicate position of the process kit component 14 within the reaction chamber 12 along the carrying axis 148 (shown in FIG. 2). It is contemplated that the carrying axis sensor 101 is associated, e.g., coupled, with the first slide member 114 (shown in FIG. 2) and the second slide member 116 (shown in FIG. 2) to indicate a carrying position 66 according to sliding of the first slide member 114 and the second slide member 116 through the first bushing 108 and the second bushing 110, respectively. In certain examples, the carrying axis sensor 101 may include a laser displacement sensor. Examples of suitable laser displacement sensors include LK-G5000 series laser displacement sensors, available from the Keyence Corporation of Osaka, Japan.

The seating axis sensor 103 is configured to indicate position of the process kit component 14 within the reaction chamber 12 along the seating axis 150 (shown in FIG. 4). In this respect the seating axis sensor 103 is associated with the male threaded member 124 (shown in FIG. 2) and the second slide member 116 (shown in FIG. 2) and to indicate a seating axis position 68 of the process kit component 14 according to rotary position of the male threaded member 124 about the seating axis 150. In certain examples, the seating axis sensor 103 may also include a laser displacement sensor or a rotary position sensor. Examples of suitable laser displacement sensors include LK-G5000 series laser displacement sensors, available from the Keyence Corporation of Osaka, Japan. Examples of suitable rotary position sensors include Vishay Model 657 industrial rotary position sensors, available from Vishay Intertechnology Inc. of Malvern, Pa.

Figures 9A, 9B, 9C, 9D:
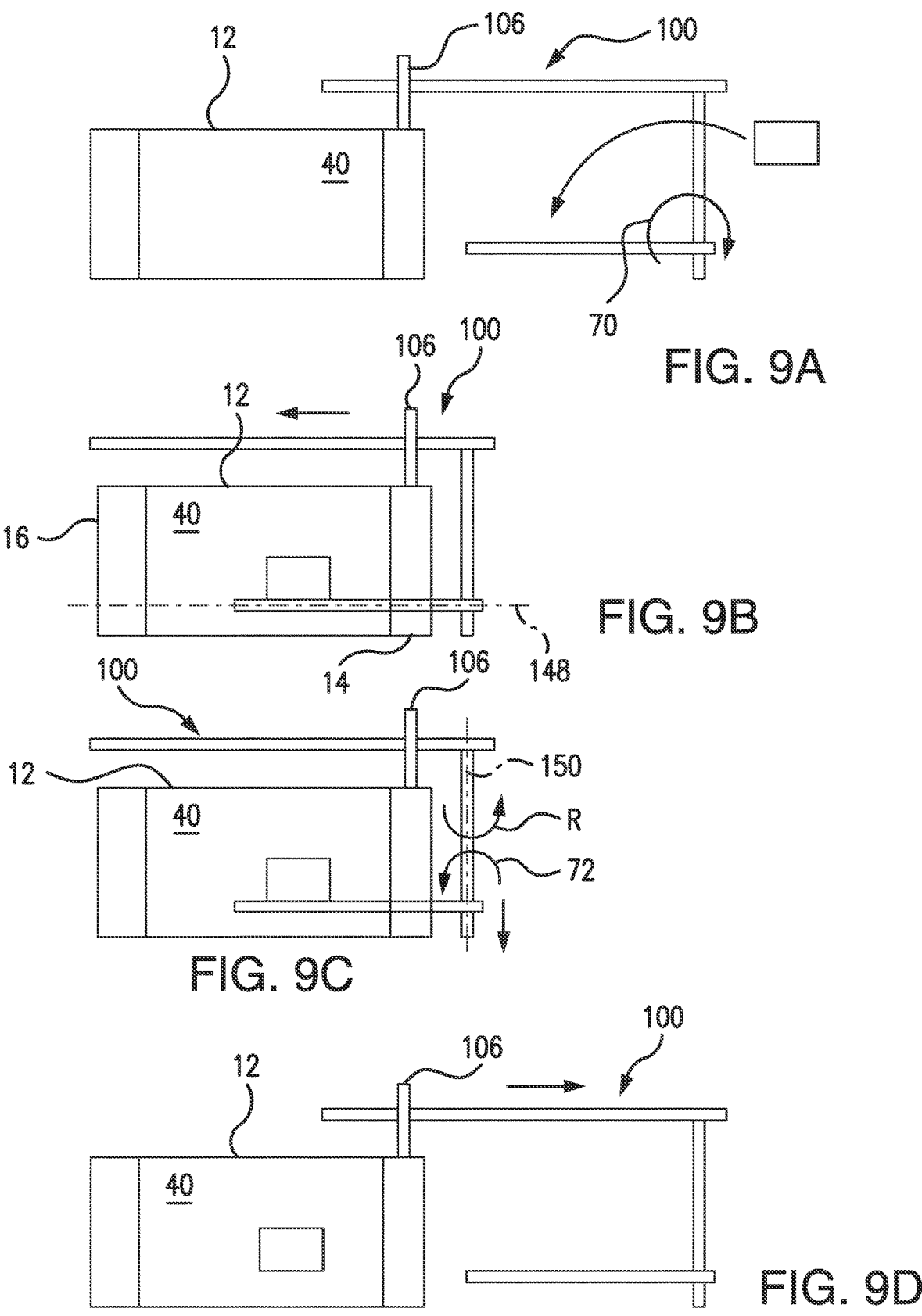
FIGS. 9A-9D are side views of the reaction chamber and the fixture of FIG. 1, schematically showing the fixture carrying and seating a singular process kit component within the reaction chamber.

With reference to FIGS. 9A-11E, the fixture 100 is shown positioning the process kit component 14 within the reaction chamber 12. Referring to FIGS. 9A-9D, the fixture 100 may be employed to position the process kit component 14 as a singular process kit component within the reaction chamber 12. As shown in FIG. 9A, the fixture 100 is first fixed relative to the reaction chamber 12. Fixation of the fixture 100 to the reaction chamber 12 may be accomplished by fastening the standoff 106 to the injection flange 42 (shown in FIG. 1) through the standoff bracket 104 (shown in FIG. 2) and the standoff plate 102 (shown in FIG. 2). The process kit component 14 is thereafter supported on a paddle member, e.g., one or more of the central paddle member 142 (shown in FIG. 2) or the first lateral paddle member 144 (shown in FIG. 2) or the second lateral paddle member 146 (shown in FIG. 2), for carrying into the reaction chamber 12. For example, the spider 58 (shown in FIG. 1) or the susceptor 56 (shown in FIG. 1) may be supported on the central paddle member 142. Alternatively, the outer ring 52 (shown in FIG. 1) or the intermediate shelf 54 (shown in FIG. 1), may be supported on the first lateral paddle member 144 and the second lateral paddle member 146.

As shown in FIG. 9B, the singular process kit component 14 is then carried into the reaction chamber 12. In certain examples, the singular process kit component 14 may be carried into the reaction chamber 12 through the injection flange 42. In accordance with certain examples, the singular process kit component 14 may be carried into the reaction chamber 12 through the exhaust flange 38. Carrying of the process kit component 14 may be accomplished, for example, by sliding the first slide member 114 (shown in FIG. 2) through the first bushing 108 (shown in FIG. 2) and the second slide member 116 (shown in FIG. 2) through the second bushing 110, the sliding translating the central paddle member 142 (shown in FIG. 2) and/or the first lateral paddle member 144 (shown in FIG. 2) and the second lateral paddle member 146 (shown in FIG. 2) along the carrying axis 148. Sliding of the first slide member 114 and the second slide member 116 may be accomplished, for example, using the carrying axis handle 170 (shown in FIG. 2).

As shown in FIG. 9C, the singular process kit component 14 is thereafter registered within the interior 40 of the reaction chamber 12, e.g., by aligning or centering the process kit component 14 is relation to the shaft 60 (shown in FIG. 1). Once registered, the singular process kit component 14 is seated within the interior 40 of the reaction chamber 12. Seating may be accomplished by rotating R the male threaded member 124 about the rotation axis 150, the rotation R translating the process kit component 14 along the seating axis 150 via the male threaded member 124 (shown in FIG. 2), the pivot bracket 138 (shown in FIG. 2), the cantilevered plate 140 (shown in FIG. 2), and the paddle member(s) supporting the process kit component 14.

As shown in FIG. 9D, paddle member (s), e.g., the center paddle member 142 or the first lateral paddle member 144 and the second lateral paddle member 146, are thereafter withdrawn from the reaction chamber 12 along the carrying axis 148 by again sliding the first slide member 114 through the first bushing 108 and the second slide member 116 through the second bushing 110.

In certain examples, droop 70 (shown in FIG. 9A) of the central paddle member 142 and/or the first lateral paddle member 144 and the second paddle member 146 associated with the load of the process kit component 14 may be adjusted subsequent to loading and/or unloading of the process kit component 14. For example, the droop 70 associated with load exerted by the singular process kit component 14 may be reduced (or eliminated) by advancing either (or both) the first droop/inclination adjustment screw 190 (shown in FIG. 5) and second droop/inclination adjustment screw 192 (shown in FIG. 5), as shown in FIG. 9A. Inclination 72 of the associated with reduction in load may be reduced (or eliminated) by retracting either (or both) the first droop/inclination adjustment screw 190 (shown in FIG. 5) and second droop/inclination adjustment screw 192 (shown in FIG. 5) subsequent to seating the singular process kit component 14 within the interior 40 of the reaction chamber 12, as shown in FIG. 9C. It is also contemplated that, in accordance with certain examples, that droop and/or inclination adjustment may be according to droop or inclination indicated by disposition of the droop/inclination indicator pin 194 (shown in FIG. 6) in the arcuate slot 196 (shown in FIG. 6).

Figures 10A, 10B, 10C, 10D:
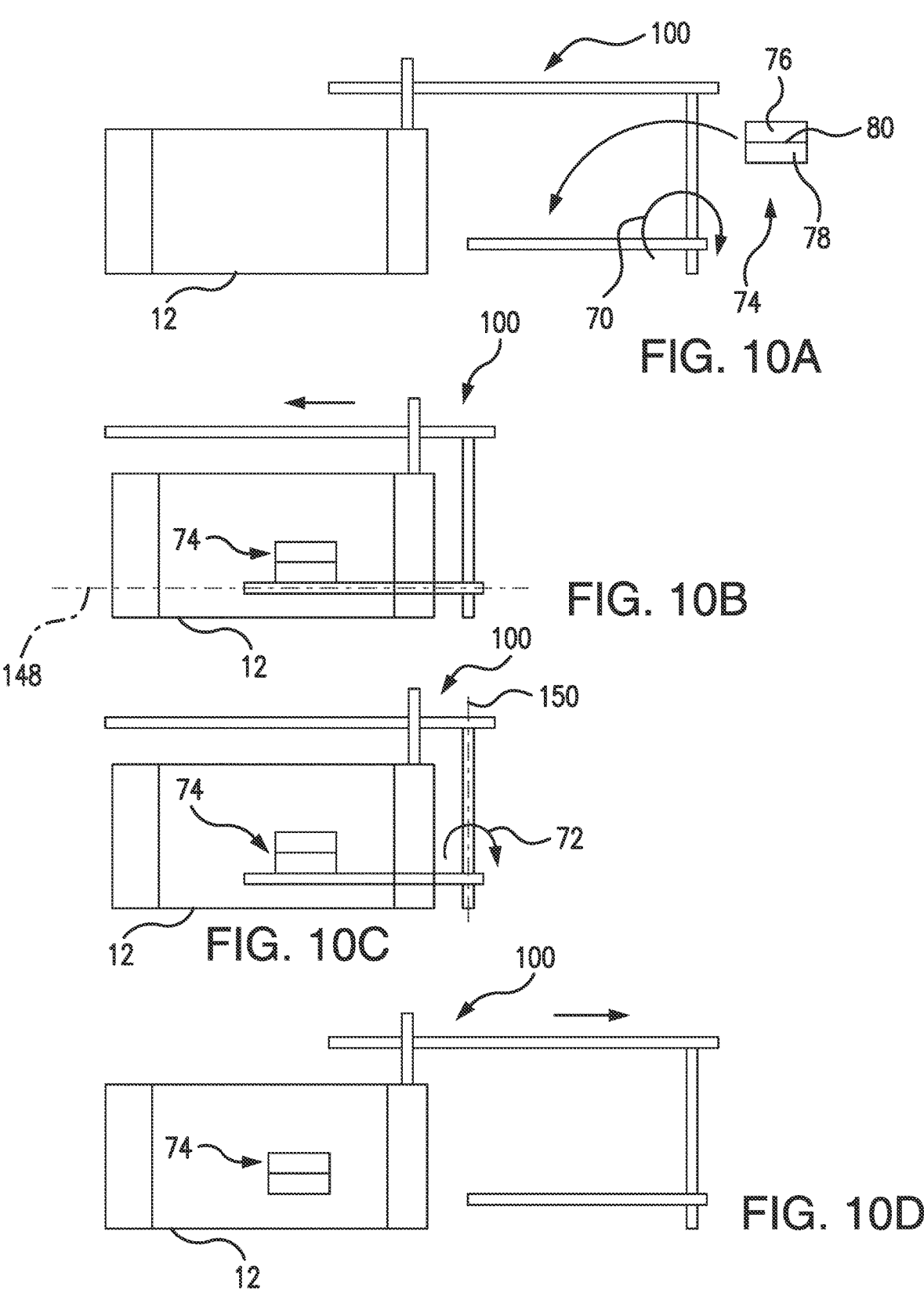
FIGS. 10A-10D are side views of the reaction chamber and the fixture of FIG. 1, schematically showing the fixture carrying and seating a process kit component pair within the reaction chamber using a registration established outside of the reaction chamber.

Referring to FIGS. 10A-10D, the fixture 100 may be employed to position a process kit component pair 74 within the reaction chamber 12. As shown in FIG. 10A, the fixture 100 is first fixed relative to the reaction chamber 12. Next, a first process kit component 76 component is supported on the fixture 100. A second process kit component 78 is thereafter supported on the fixture 100. As shown in FIG. 10B, the process kit component pair 74 is then carried into the reaction chamber 12. As shown in FIG. 10C, the process kit component pair 74 is then seated within the reaction chamber 12. As shown in FIG. 10D, the paddle member, e.g., one or more of the center paddle member 142 or the first lateral paddle member 144 and the second lateral paddle member 146, is thereafter withdrawn from the reaction chamber 12. As will be appreciated by those of the skill in the art in view of the present disclosure, positioning the process kit pair 74 within the reaction chamber 12 during a single trip may limit time required to assemble the reaction chamber 12 and/or replace process kit components within the reaction chamber 12.

In certain examples, the second process kit component 78 may be supported on the fixture 100 in registration 80 with the first process kit component 76 prior to carrying and seating the process kit component pair 74 within the reaction chamber 12. For example, the process kit component pair 74 may include the spider 58 (shown in FIG. 1) and the susceptor 56 (shown in FIG. 1), the spider 58 may be supported on the central paddle member 142 (shown in FIG. 2), the susceptor 56 may be supported on the spider 58 and the central paddle member 142, and a susceptor/spider registration 80 established while the spider 58 and the susceptor 56 are supported on the fixture 100 outside of the reaction chamber 12. Alternatively, the process kit component pair 74 may include the intermediate shelf 54 (shown in FIG. 1) and the susceptor 56, the susceptor 56 may be supported on the central paddle member 142, and an intermediate shelf/susceptor registration 80 established while the intermediate shelf 54 and the susceptor 56 are supported on the fixture 100 outside of the reaction chamber 12. Advantageously, establishing the registration 80 outside of the reaction chamber 12 may simplify positioning the process kit component pair 74 as the second process kit component 78 may be registered directly to the first process kit component 76, avoiding the need to manipulate the process kit components of the process kit component pair 74 indirectly once within the reaction chamber 12 to establish the registration 80.

Referring to FIGS. 11A-11D, the fixture 100 may be employed to position a complete process kit 82 within the reaction chamber 12 in a single trip into the reaction chamber 12. As shown in FIG. 11A, the fixture 100 is again first fixed relative to the reaction chamber 12. Next, the spider 58 is supported on the central paddle member 142 (shown in FIG. 2) and the outer ring 52 supported on the first lateral paddle member 144 (shown in FIG. 2) and the second lateral paddle member 146 (shown in FIG. 2). The susceptor 56 is thereafter supported on the spider 58 and the central paddle member 142, and the intermediate shelf 54 supported on the first lateral paddle member 144 and the second lateral paddle member 146.

As shown in FIG. 11B, the complete process kit 82 is then carried into the reaction chamber 12. As shown in FIG. 11C, the complete process kit 82 is then seated within the reaction chamber 12. As shown in FIG. 11D, the center paddle member 142, the first lateral paddle member 144 and the second lateral paddle member 146 are thereafter withdrawn from the reaction chamber 12. As will be appreciated by those of the skill in the art in view of the present disclosure, positioning the complete process kit 82 within the reaction chamber 12 during a single trip into the reaction chamber 12 may further limit time required to assemble the reaction chamber 12 and/or replace process kit components within the reaction chamber 12.

In certain examples, the susceptor 56 may be registered to the spider 58 while outside of the reaction chamber 12 in a susceptor/spider registration 84. In accordance with certain examples, the intermediate shelf 54 may be registered to the susceptor 56 while outside of the reaction chamber 12 in an intermediate shelf/susceptor registration 86. The complete process kit 82 may thereafter be carried and seated within the reaction chamber 12 in the registration established outside of the reaction chamber 12, e.g., the susceptor/spider registration 84 and/or the intermediate shelf/susceptor registration 86. Advantageously, establishing the susceptor/spider registration 84 and the intermediate shelf registration 86 outside of the reaction chamber 12 may simplify positioning the complete process kit 82 within the reaction chamber 12 by avoiding the need to manipulate the process kit components individually once within the reaction chamber 12.

With reference to FIG. 12 a method 200 of positioning a component of a process kit in a reaction chamber of a semiconductor processing system, e.g., the process kit 14 (shown in FIG. 1) in the reaction chamber 12 (shown in FIG. 1) of the semiconductor processing system 10 (shown in FIG. 1), is shown. As shown with box 210, the method 200 includes fixing a standoff, e.g., the standoff 106 (shown in FIG. 2), to the reaction chamber. As shown with box 220, the method 200 further includes supporting a process kit component on a paddle member of the fixture, e.g., on the central paddle member 142 (shown in FIG. 2) and/or the first lateral paddle member 144 (shown in FIG. 2) and the second lateral paddle member 146 (shown in FIG. 2), as shown with box 220. In certain examples, the process kit component may be a spider, e.g., the spider 58 (shown in FIG. 1), as shown with box 222. In accordance with certain examples, the process kit component may a susceptor, e.g., the susceptor 56 (shown in FIG. 1), as shown with box 224. It is also contemplated that the process kit component may be an outer ring or an intermediate shelf e.g., the outer ring 52 (shown in FIG. 1) or the intermediate shelf 54 (shown in FIG. 1), as shown with box 226 and box 228.

As shown with box 230, in certain examples, the method 200 may include indicating paddle member inclination or droop using a droop/inclination indicator pin, e.g., with the droop/inclination indicator pin 194 (shown in FIG. 6). As shown with box 240, the method 200 may include adjusting paddle member droop or inclination using a droop/inclination adjustment screw, e.g., by advancing or retracting either (or both) the first droop/inclination screw 190 (shown in FIG. 5) and the second droop/inclination screw 192 (shown in FIG. 5). For example, the fixture may be adjusted to reduce or eliminate paddle member droop due to load exerted by the process kit component on the paddle member subsequent to supporting the process kit component of the paddle member. The fixture may be adjusted to reduce or eliminate paddle member inclination due to reduction of the load on the paddle member subsequent to seating the process kit component within the reaction chamber.

As shown with box 250, it is contemplated that the method 200 include carrying the process kit component into the reaction chamber. In certain examples, the intermediate shelf may be carried into the reaction chamber in registration with the susceptor, as shown with box 254. In accordance with certain examples, the susceptor may be carried into the reaction chamber in registration with the spider, as shown with box 256. In further examples, position of the paddle member and/or the process kit component may be indicated using a carrying axis sensor during movement within the reaction chamber, e.g., using the carrying axis sensor 101 (shown in FIG. 8), as shown with box 260. As will be appreciated by those of skill in the art in view of the present disclosure, indicating carrying axis position of the paddle member may limit (or eliminate) the likelihood of damage during the carrying of the process kit component within the reaction chamber.

As shown with box 270, it is also contemplated that the method 200 include seating the process kit component into the reaction chamber, e.g., by rotating the male threaded member 124 (shown in FIG. 2) about the seating axis 150 (shown in FIG. 4). In certain examples, the intermediate shelf may be seated within the reaction chamber in registration with the susceptor, as shown with box 272. In accordance with certain examples, the susceptor may be seated within the reaction chamber in registration with the one spider, as shown with box 274. In further examples, position of the paddle member along the seating axis may be indicated using a seating axis sensor, e.g., using the seating axis sensor 103 (shown in FIG. 8), as shown with box 280. As will be appreciated by those of skill in the art in view of the present disclosure, indicating seating axis position of the paddle member may limit (or eliminate) the likelihood of damage during the carrying of the process kit component within the reaction chamber.

As shown with box 290, the method 200 may further include matching position of the process kit component within the reaction chamber to position of a like-process kit component in another reaction chamber. As shown with box 292, matching position of the process kit component within the reaction chamber may include matching carrying axis position of the process kit component being matched to a carrying position of the like-process kit component within the reaction chamber being matched. As shown with box 294, matching position of the process kit component with the reaction chamber may include matching seating axis position of the process kit component to the seating axis position of the like-process kit component within the reaction chamber being matched. As will be appreciated by those of skill in the art in view of the present disclosure, positioning the process kit component within the reaction to an indicated carrying axis position and/or seating axis position may simplify and/or reduce time required to match reaction chamber performance, e.g., by reducing reliance upon the skill and experience of the service engineer positioning the process kit component within the reaction chamber.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

PARTS LIST

10 Semiconductor Processing System
12 Reaction Chamber
14 Process Kit Component
16 First Precursor Source
18 Second Precursor Source
20 Purge Source
22 First Precursor
24 Second Precursor
26 Purge or Carrier Gas
28 Film
30 Substrate
32 Elongated Body
34 Injection End
36 Exhaust End
38 Exhaust Flange
40 Interior
42 Injection Flange
44 Transmissive Material
46 Heat Lamps
48 Exhaust End Shelf
50 Injection End Shelf
52 Outer Ring
54 Intermediate shelf
56 Susceptor
58 Spider
60 Shaft
62 Drive Module
64 Rotation Axis
66 Carrying Axis Position
68 Seating Axis Position
70 Droop
72 Inclination
74 Process Kit Component Pair
76 First Process Kit Component
78 Second Process Kit Component
80 Registration
82 Complete Process Kit
84 Susceptor/Spider Registration
86 Intermediate shelf/Susceptor Registration
100 Fixture
102 Standoff Plate
104 Standoff Bracket 106 Standoff
108 First Bushing
110 Second Bushing
112 Bumper
114 First Slide Member
116 Second Slide Member
118 End Plate
120 End Block
122 Bearing Arrangement
124 Rotary Member
126 First Guide Pin
128 Second Guide Pin
130 Threaded Block
132 Trunnion Pin
134 Droop/Inclination Indicator
136 Droop/Inclination Controller
138 Pivot Bracket
140 Cantilevered Plate
142 Central Paddle Member
144 First Lateral Paddle Member
146 Second Lateral Paddle Member
148 Carrying Axis
150 Seating Axis
152 Male Threads
154 Seating Knob
156 Female Threaded Aperture
158 First Guide Pin Aperture
160 Second Guide Pin Aperture
162 First Pivot Stop
164 Second Pivot Stop
166 First Lateral Face
168 Second Lateral Face
170 Carrying Axis Handle
172 Axial Slot
174 Oblique Slot
176 Central Ledge
178 First Lateral Ledge
180 First Tine Member
182 First Tine Surface
184 Second Lateral Ledge
186 Second Tine Member
188 Second Tine Surface
190 First Droop/Inclination Adjustment Screw
192 Second Droop/Inclination Adjustment Screw
194 Indicator Pin
196 First Arcuate Slot
198 Second Arcuate Slot
101 Carrying Axis Sensor
103 Seating Axis Sensor
200 Method
210 Box
220 Box
222 Box
224 Box
226 Box
228 Box
230 Box
240 Box
250 Box
252 Box
254 Box
260 Box
270 Box
272 Box
274 Box
280 Box
290 Box 292 Box
294 Box

The invention claimed is:

1. A fixture, comprising:
a standoff configured for fixation relative to a reaction chamber of a semiconductor processing system;
a slide member slidably supported by the standoff and translatable along a carrying axis extending into the reaction chamber; and
a male threaded member depending from the slide member and rotatable about a seating axis, the seating axis angled relative to the carrying axis;
a paddle member depending from the male threaded member and defining the carrying axis, wherein the paddle member is fixed relative to the slide member along the carrying axis to carry a process kit component into the reaction chamber using translation of the slide member, and wherein the paddle member is free relative to the slide member along the seating axis to seat the process kit component within the reaction chamber using rotation of the male threaded member;
a standoff plate fixedly coupled to the reaction chamber; and
a standoff bracket depending from the standoff plate, the standoff bracket cantilevered from the standoff plate along the carrying axis and supporting the standoff.

2. The fixture of claim 1, further comprising a bushing seated in the standoff and extending about the slide member, wherein the bushing protrudes from the standoff along the carrying axis to limit yaw and pitch of the paddle member.

3. The fixture of claim 1, wherein the slide member is a first slide member and further comprising a second slide member slidably supported by the standoff, wherein the second slide member is fixed relative to the first slide member to limit roll of the paddle member.

4. The fixture of claim 1, further comprising a bumper seated in the standoff and protruding from the standoff along the carrying axis parallel to the slide member to limit translation of the paddle member along the carrying axis.

5. The fixture of claim 1, further comprising a threaded block depending from the male threaded member and coupling the paddle member to the slide member, the threaded block translatable along the seating axis according to rotation of the male threaded member about the seating axis.

6. The fixture of claim 1, further comprising:
a carrying axis position sensor associated with the slide member to indicate position of the paddle member along the carrying axis; and
a seating axis position sensor associated with the male threaded member to indicate position of the paddle member along the seating axis.

7. The fixture of claim 1, further comprising:
a droop/inclination indicator associated with the paddle member to indicate droop and inclination of the paddle member; and
a droop/inclination controller operatively associated with the paddle member to control droop and inclination of the paddle member.

8. The fixture of claim 1, further comprising:
a threaded block depending from the male threaded member;
a guide pin slidably received in the threaded block and extending in parallel with the male threaded member, and a pivot bracket pivotably depending from the threaded block, wherein the pivot bracket couples the paddle member to the threaded block.

9. The fixture of claim 8, wherein the pivot bracket defines an arcuate slot with a convex shape, the fixture further comprising an indicator pin seated in the threaded block and protruding into the indicator slot to indicate droop and inclination of the paddle member.

10. The fixture of claim 8, further comprising:
a trunnion pin seated in the threaded block and pivotably coupling the pivot bracket to the threaded block; and
a droop/inclination adjustment screw threadedly received in the threaded block and abutting the pivot bracket, wherein the droop/inclination adjustment screw abuts the pivot bracket at a location along the seating axis between the trunnion pin and the paddle member and is configured to control at least one of droop and inclination of the paddle member.

11. The fixture of claim 1, wherein the paddle member is a central paddle member with a slot conforming to the process kit component, the fixture further comprising at least one lateral paddle member cantilevered from the threaded member with a lateral ledge conforming to another process kit component.

12. The fixture of claim 1, wherein the process kit component is a spider supported on the paddle member, and further comprising a susceptor seated on the spider and carried therethrough by the paddle member, wherein the susceptor is registered to the spider with a susceptor/spider registration established outside of the reaction chamber.

13. The fixture of claim 1, wherein the process kit component is a susceptor supported on the paddle member and further comprising an intermediate shelf supported on the fixture, wherein the intermediate shelf is registered to the susceptor with an intermediate shelf/susceptor registration established outside of the reaction chamber.

14. A semiconductor processing system, comprising:
a reaction chamber with an injection end and an opposite exhaust end;
an injection flange connected to the injection end of the reaction chamber;
a fixture as recited in claim 1, wherein the standoff is supported by the injection flange and connected therethrough to the reaction chamber; and
a process kit component supported by the paddle member outside of the reaction chamber for carrying and seating within the reaction chamber using the fixture.

15. The semiconductor processing system of claim 14, wherein the at least one process kit component is a singular process kit component.

16. The semiconductor processing system of claim 14, wherein the process kit component is a first process kit component and further comprising a second process kit component, wherein the second process kit component is registered to the first process kit component.

17. The fixture of claim 1, wherein the standoff is fixed relative to the reaction chamber.

18. The fixture of claim 7, the droop/inclination indicator comprising:
an arcuate slot extending along the carrying axis; and
an indicator pin seated within a threaded block,
wherein the indicator pin protrudes into the arcuate slot.

* * * * *